United States Patent
Dalman et al.

(10) Patent No.: US 6,866,764 B2
(45) Date of Patent: Mar. 15, 2005

(54) PROCESSES FOR FABRICATING PRINTED WIRING BOARDS USING DENDRITIC POLYMER COPPER NANOCOMPOSITE COATINGS

(75) Inventors: David A. Dalman, Midland, MI (US); Petar R. Dvornic, Midland, MI (US)

(73) Assignee: Michigan Molecular Institute, Midland, MI (US)

( * ) Notice: Subject to any disclaimer, the term of this patent is extended or adjusted under 35 U.S.C. 154(b) by 419 days.

(21) Appl. No.: 10/080,295

(22) Filed: Feb. 21, 2002

(65) Prior Publication Data

US 2003/0155248 A1 Aug. 21, 2003

(51) Int. Cl.$^7$ .............................. C25D 5/02; C25D 5/24
(52) U.S. Cl. ...................... 205/125; 205/118; 205/122; 205/158; 205/183; 205/221; 205/223; 205/229
(58) Field of Search ................................ 205/118, 122, 205/125, 158, 183, 220, 221, 223, 229; 204/118, 122, 125, 158, 183, 220, 221, 223, 229

(56) References Cited

U.S. PATENT DOCUMENTS

| | | | |
|---|---|---|---|
| 5,334,292 A | * | 8/1994 | Rajeshwar et al. ......... 205/419 |
| 5,739,218 A | | 4/1998 | Dvornic et al. ............. 525/487 |
| 5,902,863 A | | 5/1999 | Dvornic et al. ............. 525/431 |
| 5,938,934 A | | 8/1999 | Balogh et al. ............... 210/688 |
| 6,077,500 A | | 6/2000 | Dvornic et al. ....... 424/DIG. 16 |
| 6,212,769 B1 | | 4/2001 | Boyko et al. ................. 29/852 |
| 6,248,668 B1 | * | 6/2001 | Beebe et al. ................ 438/702 |
| 6,682,642 B2 | * | 1/2004 | Mikkola et al. ............ 205/296 |

* cited by examiner

Primary Examiner—Nam Nguyen
Assistant Examiner—Brian L. Mutschler
(74) Attorney, Agent, or Firm—Price, Heneveld, Cooper, DeWitt & Litton

(57) ABSTRACT

An inexpensive process for depositing an electrically conductive material on selected surfaces of a dielectric substrate may be advantageously employed in the manufacture of printed wiring boards having high quality, high density, fine-line circuitry, thereby allowing miniaturization of electronic components and/or increased interconnect capacity. The process may also be used for providing conductive pathways between opposite sides of a dielectric substrate and in decorative metallization applications. The process includes steps of depositing a radially-layered dendritic copolymer on selected surfaces of a dielectric substrate; cross-linking the radially-layered dendritic copolymer to form a dendritic polymer network; sorbing metal cations into the cross-linked dendritic polymer network; reducing the metal cations to form a nanocomposite composition exhibiting adequate surface electrical conductivity for electroplating; and electroplating a metal onto the nanocomposite composition to form an electrically conductive deposit.

36 Claims, No Drawings

PROCESSES FOR FABRICATING PRINTED WIRING BOARDS USING DENDRITIC POLYMER COPPER NANOCOMPOSITE COATINGS

STATEMENT REGARDING FEDERALLY SPONSORED RESEARCH OR DEVELOPMENT

The U.S. Government may have certain rights in this invention which was made under U.S. Army, Space and Missile Defense Command government contract No. DASG60-00-M-0128.

FIELD OF THE INVENTION

This invention relates to processes for depositing an electrically conductive material on a selected surface of a dielectric substrate, and in particular embodiments of the invention to processes for forming electrically conductive vias in multi-layer printed wiring boards and processes for forming electrically conductive circuit patterns on dielectric substrates.

BACKGROUND OF THE INVENTION

Competition in the electronics industry is currently being driven by a continual need for smaller components and devices. Miniaturization will likely remain a fundamental driving force for the electronics industry for the foreseeable future. In order to meet the requirement for continually smaller electronic components on packages such as printed wiring boards and laminated chip carriers, it will be necessary to develop printed circuit fabrication techniques which allow narrower circuit patterns and higher resolution.

Typically, manufacturers employ three technologies for fabrication of printed wiring boards. These include the many varieties of subtractive, semi-additive, and full additive processes for fabricating fine-line circuitry on printed wiring boards. Each of these processes has known difficulties and limitations with regard to producing high quality, high density, fine-line circuitry.

A conventional subtractive process requires that a full panel plating of copper be employed followed by imaging and developing of an overcoated resist layer, followed by etching of the copper in areas where the resist was removed. Major problems associated with this process include the fact that large amounts of copper must be etched away and that it is common for undercutting of the remaining circuitry to occur, especially the well known galvanic etching in areas where noble metals are present in proximity to the copper circuitry. There is also a problem of insufficient resolution using the subtractive process. This significantly limits the ultimate density of the fine-line circuitry. For example, it is well known that as the line or space dimension approaches the thickness of the layer to be etched, subtractive etching becomes unacceptable. To remedy this situation, the etch mask must be made larger than the desired feature to allow for this lateral etching.

To circumvent problems associated with the subtractive process, additive processes have been employed. However, problems are encountered with the need for an adhesion promoting seed layer that must be applied after a photoresist layer is imaged. This seed layer covers not only the desired areas to be plated but also covers the top surfaces of the photoresist layer. This can cause copper to be plated in areas where copper plating is not desired. To circumvent this problem, the photoresist must be chemically or mechanically cleaned of the seed layer. Mechanical etching of the seed layer is known to cause physical defects in the final product due to minute particles causing conductive junctions between what should have been discrete circuit lines. Another potential defect caused by mechanical cleaning is that stress placed on the microcomponent can potentially cause delamination. Also, the process is relatively expensive due to the required build-up of copper microcircuitry during electroless plating.

To address problems associated with both the additive and subtractive processes, a semi-additive process has been utilized. A typical semi-additive process involves laminating a thin layer of copper to a substrate, coating the thin layer of copper with a resist layer, imaging and developing the resist layer to expose selected portions of the underlying thin copper layer, electroplating the exposed areas of the thin copper layer, removing the remaining photoresist, and etching the uncovered thin copper layer to create discrete microcomponent features. The minimum thickness of the copper foil that can be applied in the semi-additive process is limited by handling problems during the lamination process, and this minimum thickness is larger than would be desired in order to create extremely fine line features.

In order to provide electrical continuity between opposite sides of a substrate having printed circuitry on both sides, metallized through-holes or vias are provided in printed wiring boards. The predominant method for metallization of through-holes or vias is by electroless copper plating followed by electroplating. This process uses as many as 8 separate steps involving as many as 17 processing tanks. The process uses chelated copper cations in solution and formaldehyde as a reducing agent. The formaldehyde is toxic and is being legislated out of use, while the waste treatment and recovery of chelated copper cations is particularly difficult. Further, adhesion of electroless copper to a glass/epoxy core of FR-4 laminates is a challenging problem, especially under increasingly stringent thermal cycling testing. There are alternative electroless plating processes on the market, but these processes cannot meet the testing requirement for adhesion in thermal cycling in flex-rigid boards for certain military and other applications.

Accordingly, there is a need for improved processes for selectively depositing an electrically conductive material on a dielectric substrate. In particular, an additive process for fabricating fine-line circuitry on printed wiring boards which overcomes the problems associated with conventional additive, subtractive and semi-additive processes would be desirable. Further, improved processes for metallization of the walls of through-holes or vias in printed wiring boards, which eliminate problems associated with electroless plating, would be highly desirable.

SUMMARY OF THE INVENTION

The invention provides a relatively inexpensive process for depositing an electrically conductive material on a selected surface of a dielectric substrate. The process may be advantageously employed in the manufacture of printed wiring boards having high quality, high density, fine-line circuitry, whereby further miniaturization of electronic components and/or increased interconnect capacity may be achieved. The processes of is invention may also be advantageously employed as an alternative to electroless plating in a variety of applications, including metallization of through-holes used for providing conductive pathways between opposite sides of a dielectric substrate.

The process includes the following steps: (a) depositing on a selected surface of a dielectric substrate a radially-layered dendritic copolymer having a hydrophilic interior and an organosilicon exterior; (b) cross-linking the radially-layered dendritic copolymer to form a dendritic polymer network having hydrophilic and hydrophobic nanoscopic domains; (c) sorbing metal cations in the cross-linked dendritic polymer network; (d) reducing the metal cations in the cross-linked dendritic polymer network to form a nanocomposite composition having elemental metal atoms contained within the cross-linked dendritic polymer network, whereby the nanocomposite composition exhibits adequate surface electrical conductivity for electroplating; and (e) electroplating a metal onto the nanocomposite composition to form an electrically conductive deposit.

These and other features, advantages and objects of the present invention will be further understood and appreciated by those skilled in the art by reference to the following specification and claims.

DESCRIPTION OF THE PREFERRED EMBODIMENTS

The present invention provides methods of selectively depositing a metal on a dielectric substrate by forming a polymeric coating on the dielectric substrate, sorbing metal ions into the polymeric coating, reducing the sorbed metal ions to form a composite containing elemental metal and exhibiting sufficient conductivity to allow electroplating of a metal onto the composite composition, and electroplating a metal onto the composite composition.

The polymer coating is prepared with a radially-layered dendritic copolymer having a hydrophilic interior that is capable of sorbing metal ions, and a hydrophobic exterior capable of adhering tenaciously to a dielectric substrate. A radially-layered dendritic copolymer is a dendritic copolymer having at least two chemically distinct domains, in which one of the domains surrounds the other domain, wherein the solubility properties of the radially-layered dendritic polymer are determined by the chemical properties of the external domain. More specifically, the radially-layered dendritic polymers employed in the processes of this invention have a hydrophilic internal domain that is capable of complexing or otherwise retaining metal cations, and a hydrophobic, water-insoluble external domain that surrounds he hydrophilic interior domain.

Examples of radially-layered dendritic copolymers that may be employed in the processes of this invention are described in U.S. Pat. Nos. 5,739,218; 5,902,863; 5,938,934; and 6,077,500, each of which is incorporated in its entirety by reference herein. Preferred radially-layered dendritic copolymers for use in the processes of this invention include the radially-layered copoly(amidoamine-organosilicon) (PAMAMOS) and radially-layered copoly(propyleneimine-organosilicon) (PPIOS) dendrimers described in U.S. Pat. No. 5,739,218. These radially-layered copolymer dendrimers are prepared by reacting a hydrophilic dendrimer such as a poly(amidoamine) (PAMAM) or poly(propyleneimine) (PPI) with an organosilicon modifier. In the case of amine-terminated PAMAM and PPI dendrimers, the $—NH_2$ groups at the surface of the dendrimer may be reacted with a silane or siloxane of the respective formulae $XSiR_n Y_{(3-n)}$ or $XR''_p Y_{2-p} Si(OSiR''_2)_m OSiR''_n Y_{3-n}$ wherein m represents zero to 100; n represents zero, one, two, or three; and p represents zero, one, or two. X can be any group that reacts with $—NH_2$ such as $CH_2=CHCOO(CH_2)_3—$, $ClCH_2—$, $BrCH_2—$ or $ICH_2—$. Other groups that react with $—NH_2$ can also be employed, such as epoxy, $ClCO(CH_2)_a—$, $R'''OCO(CH_2)_a—$, $NCO—$ R''''—, or $NCOCH_2 CH=CH—$, wherein a in these other groups represents an integer having a value of 1–6, R, R', R", R''', and R'''' are preferably alkyl radicals containing 1–6 carbon atoms, most preferably methyl, an aryl radical such as phenyl, or a fluoroalkyl radical such as $—(CH_2)_2CF_3$ or $—(CH_2)_2 (CF_2)_3 CF_3$. Y represents a group that does not react with $—NH_2$ such as the vinyl group $CH_2 =CH—$, the allyl group $CH_2 =CH—CH_2—$, $—OR$, hydrogen, a triorganosiloxy radical, or a ferrocenyl radical.

Representative examples of such organosilicon compounds that can be used herein, are (3-acryloxypropyl)methyldimethoxysilane, (3-acryloxypropyl)bis(vinyldimethylsiloxy) methylsilane, (3-acryloxypropyl)dimethylmethoxysilane, (3-acryloxypropyl)trimethoxysilane, chloromethyldimethylvinylsilane, iodomethyldimethylvinylsilane, chloromethyldimethylallylsilane, etc.

Lower generation hydrophilic dendrimers (e.g., generation 2, 3 or 4) are preferred starting materials for preparation of the radially-layered copolymeric dendrimers used in the process of this invention on account of their lower cost as compared with higher generation dendrimers. Desirably, the reaction between the surface functional groups of the hydrophilic dendrimer and the organosilicon modifier is sufficient to render the reaction product water-insoluble.

Other dendritic polymers that can be reacted with an organosilicon modifier to produce a radially-layered dendritic copolymer having a hydrophilic interior capable of sorbing (i.e., complexing with or otherwise retaining) metal cations and a hydrophobic exterior capable of being cross-linked and capable of adhering tenaciously to a dielectric (i.e., electrically nonconductive) substrate include hyperbranched polymers such as hyperbranched poly(propyleneimines), poly(amidoamines), polyamides, etc.

As is the case will all dendritic polymers (including dendrimers, dendrons, hypercombbranched polymers and the like), hyperbranched polymers are polymers having branches upon branches. However, in contrast to dendrimers, hyperbranched polymers can be prepared in a one-step, one-pot procedure. This facilitates the synthesis of large quantities of materials at high yields and at a relatively low cost. A hyperbranched polymer contains a mixture of linear and branched repeating units, whereas an ideal dendrimer contains only branched repeating units without any linear repeating units. The degree of branching, which reflects the fraction of branching sites relative to perfectly branching system (i.e., an ideal dendrimer), for a hyperbranched polymer is greater than 0 and less than 1, with typical values being from about 0.25 to about 0.45 (about 25% to about 45%). Unlike ideal dendrimers which have a polydispersity that approaches 1, hyperbranched polymers have a polydispersity that increases with increasing molecular weight, with typical polydispersities being greater than 1.1 even at a relatively low weight average molecular weight such as 1000 Daltons, and with polydispersities greater than 1.5 being typical for hyperbranched polymers having a weight average molecular weight of about 10,000 or higher. These differences between the polydispersities and degree of branching of hyperbranched polymers versus dendrimers are indicative of the relatively higher non-ideality, randomness, and irregularity of hyperbranched polymers as compared with dendrimers. However, as with the PAMAM and PPI dendrimers, hydrophilic hyperbranched polymers such as hyperbranched polypropylamine are capable of sorbing metal cations and retaining elemental metal after reduction of the metal cations in situ. In addition, surface groups on the hyperbranched polymers can be reacted with organosilicon modifiers to provide radially-layered dendritic polymers suitable for use in the processes of this invention.

Hyperbranched polymers that are suitable for use in this invention will typically have a degree of branching of from about 20% to about 55%, and more typically from about 25% to about 45%, and a weight average molecular weight of from about 1000 to about 25,000, more typically from about 2000 to about 20,000, and most typically from about 2000 to about 10,000.

The dendritic polymer precursors that may be used for preparing the radially-layered dendritic copolymers used in the processes of this invention include generally any hydrophilic dendritic polymer (e.g., hyperbranched polymer, dendrimer, etc.) having terminal functional groups that can be reacted with organosilicon modifiers that are capable of providing a reaction product having a cross-linkable hydrophobic surface, and which are capable of sorbing metal cations and retaining elemental metal after reduction of the metal cations in situ.

The processes of this invention may be employed in a variety of applications in which metallization (i.e., deposition of a metallic layer) on a dielectric (i.e., electrically non-conductive) surface is desired. For example, the process of this invention may be used in a variety of applications in which conventional electroless metal deposition is used to provide sufficient surface electrical conductivity to permit metal plating on a dielectric substrate. Commercially important applications include additive processes for forming fine-line electrical circuit patterns on rigid or flexible electrically insulative (dielectric) substrates to produce printed circuits, printed wiring boards, and the like.

Typical dielectric substrates usually have a thickness of from about 14 to about 40 mils, and more typically from about 2 to about 25 mils. The dielectric substrate are typically thermoset or thermoplastic resins and can be reinforced with glass fiber or may contain fillers. Typical thermosetting polymeric materials used for forming the dielectric substrate include epoxy resins, phenolic based materials and polyamides. Flexible circuits are typically fabricated from polyimide or polyester films which are only 1 to 2 mils thick. Examples of some phenolic-type materials include copolymers of phenol, resorcinol and cresol. Examples of suitable thermoplastic materials that may be used for forming a dielectric substrate include polyolefins such as polypropylene, polysulfones, polycarbonates, nitrile rubbers, ABS polymers and fluorinated polymeric materials such as polytetrafluoroethylene. A suitable dielectric substrate that is widely used commercially for preparing printed wiring boards is a glass-reinforced epoxy substrate designated as FR-4.

Another important application of this invention is metallization of the walls of through-holes drilled through a dielectric substrate to provide an electrically conductive pathway from one side of the dielectric substrate to the other.

The radially-layered dendritic polymers may be applied to a substrate surface or to selected areas of a substrate surface in the form of a coating composition. Suitable coating compositions comprise a solvent capable of solubilizing the selected radially-layered dendritic polymer, the selected radially-layered dendritic polymer, and may optionally contain fillers or other agents for adjusting the rheology of the coating composition for a selected coating technique. Suitable solvents for the coating compositions used in the processes of this invention include lower molecular weight alcohols, such as methanol, ethanol, propyl alcohol, diethylene glycol, and combinations thereof. Suitable concentrations of the radially-layered dendritic polymer in the coating compositions are typically from about 10% to about 30%, and more typically from about 15% to 25%, by weight of the composition. Examples of suitable rheological agents include fillers such as fumed silica, calcium carbonate and talc. Examples of suitable additives to adjust properties of the resulting coatings include co-reagents, such as tetraethoxysilane or alpha,omega-telechelic linear polymers, side-chain functionalized polymers, fillers, antioxidants, etc.

A variety of techniques may be employed for applying the coating composition to a substrate. Examples include roller-coating, dip-coating, spray-coating, and highly selective direct printing techniques using a plotter pen, transfer printing, rubber-stamping and/or inkjet printing. The thickness of the coating is not especially critical. However, the minimum coating thickness needed to achieve a desired electrical surface conductivity for electroplating subsequent to curing of the coating, sorption of metal cations, and reduction of the metal cations to elemental metal is desired to minimize cost. Suitable thicknesses for a dried coating (after evaporation of the solvent) are typically from about 5 micrometers to about 25 micrometers. Although thicker coatings may be used, this would likely increase the cost of the process without adding any significant benefit.

The radially-layered dendritic polymers used in the processes of this invention have reactive silicon-functional groups at their outer surface. The reactive silicon-functional groups at the outer surface include moieties having the formula: $R_{3-z-y}W_y$ Si, where X and W represent reactive groups; z is 1, 2 or 3; and y is 0, 1, or 2. For purposes of the present invention, any reactive silicon-functional group X or W can be used, including for example, —R'—NH$_2$, —R'—NR$_2$, mercapto (—R'SH), vinyl (—HC=CH$_2$), allyl, hydrogen, halogen, acetoxy (—O(O)CCH$_3$), ureido, acryloyl, and alkoxy or aryloxy (—OR). R represents an alkyl group containing 1–6 carbon atoms, or an aryl group such as phenyl; and R' represents the corresponding alkylene or arylene groups. The alkoxy group —OR is the most preferred reactive group. In addition, W can also be a non-reactive group, in which case it is preferably different from —CH$_3$ or —X.

Cross-linking of the radially-layered dendritic polymers to form cross-linked dendritic polymer networks can be achieved by any number of different types of reactions, including the following:

(1) catalyzed addition reactions such as hydrosilation or thiol addition, in the case of ≡SiCH=CH$_2$, ≡Si—CH$_2$—CH=CH$_2$, ≡Si—R—SH, or ≡SiH surface functionalized dendrimers;

(2) self-catalyzed reactions such as hydrolysis with moisture or water, in the case of ≡SiCl and ≡Si—OR surface functionalized dendrimers;

(3) non-catalyzed addition reactions such as Michael addition in the case of acryloyl groups; and (4) condensation reactions.

The cross-linking may be performed with or without one or more added reactants, such as small molecular weight or oligomeric (i) difunctional reagents A$_2$, (ii) trifunctional reagents A$_3$, (iii) polyfunctional reagents A$_x$ where x is 4 or more, or (iv) by simply using moisture from the atmosphere, or intentionally added water. Representative A$_2$, A$_3$, and A$_x$ reagents include organohalosilanes, tetrahalosilanes, organosilanols, organooxysilanes such as dialkoxysilanes, trialkoxysilanes, and tetraalkoxysilanes, aminoalkylalkoxysilanes, haloalkylalkoxysilanes, organo-H-silanes, organoaminosilanes, organoacyloxysilanes such as acetoxysilanes, organosilsesquioxanes, ureido-substituted silanes, vinyl-substituted silanes, allyl-substituted silanes, etc. Corresponding organic or organometallic compounds can also be employed.

It is known that dendritic polymers can degrade at elevated temperatures. For example, PAMAM dendrimers begin to lose their ability to form nanocomposites (i.e., sorb and retain metal cations) due to a retro-Michael reaction. The rate of this reaction is dependent on temperature, but it is known to occur within hours at temperatures of about 120° C. and above. Accordingly, it is preferred that the curing or cross-linking of the radially-layered dendritic polymer coating be performed at a temperature, or within a temperature range, that is sufficiently high to accelerate the curing process, but sufficiently low to prevent excessive degradation of the radially-layered dendritic polymer. Further, it has been determined that the extent of cure is inversely related to the ability of the cured coating to sorb metal cations, i.e., higher degrees of cross-linking reduce the rate of metal cation sorption and the quantity of metal cation that may be sorbed into the cross-linked dendritic polymer network. Accordingly, it may be desirable to cure the coating in two stages, including a first stage to provide adequate mechanical properties and adhesion to the substrate prior to sorption of the metal cations, and a second stage cure after sorption of the metal cations to provide sufficient mechanical properties and adhesion to the substrate for subsequent reduction of the metal cations and electroplating of a metal on to the cross-linked dendritic polymer network. The optimum curing process (including the number of cure stages, cure temperatures and cure times, etc.) will depend on a variety of factors relating to the type of radially-layered dendritic polymer that is used. In the case of a radially-layered PAMAMOS dendrimer that is the product of a generation 3 PAMAM dendrimer and (3-acryloxypropyl) methyldimethoxysilane, a suitable cure process involves a first curing stage conducted at a temperature of about 100° C. for 24 hours, followed by sorption of a metal cation, and then a second stage cure at 100° C. for an additional 24 hours. Suitable and optimum curing processes can be determined by routine experimentation for various radially-layered dendritic polymers.

It is believed that with the exception of Group I elements, all metal cations can be sorbed by radially-layered dendritic polymers such as PAMAMOS and/or PPIOS dendrimers. Representative metal cations that may be sorbed into the radially-layered dendritic polymers include $Cu^{+1}$, $Cu^{+2}$, $Fe^{+2}$, $Fe^{+3}$, $Au^{+3}$, $Co^{+2}$, $Ag^{+1}$, $Pd^{+2}$, $Rh^{+3}$, $Ni^{+2}$, $Pt^{+2}$, $Pt^{+4}$, $Eu^{+3}$, $Tb^{+3}$ and $Cd^{+2}$. The metal cations may be placed in solution with any suitable anion such as acetate, chloride or sulfate anions, with a preferred metal cation being $Cu^{+2}$ on account of its excellent electrical conductivity and relatively low cost.

After cross-linking of the radially-layered dendritic copolymer and sorption of the metal cations in the cross-linked dendritic polymer network, the metal cations in the cross-linked dendritic polymer network are reduced to form a nanocomposite composition having elemental metal atoms contained or encapsulated within the cross-linked dendritic polymer network, whereby the nanocomposite composition exhibits adequate surface electrical conductivity for a subsequent electroplating step. Several choices of chemical reducing agents are available for this task. Sodium borohydride, hydrazine, ascorbic acid, alcohols, and sodium citrate are examples of chemical reducing agents that have been successfully used for reduction of metal cations sorbed in a dendritic polymer to form elemental metal nanoclusters (i.e., clusters of elemental metal atoms having nanoscopic dimensions in the range from 1 nanometer to 10 nanometers). In the case of copper nanocomposites of PAMAM dendrimers, clusters residing inside the dendrimer have a mean size of less than about 1.8 nanometers, while copper particles that agglomerated outside of the dendrimer were determined to be approximately 9 nanometers in diameter. Reduction of the sorbed metal cations can be achieved by adding a several-fold excess of solid sodium borohydride (or other reducing agent) in an aqueous solution and contacting the solution with the cross-linked coating composition containing sorbed metal cations, such as by immersion of the coated substrate in the solution. Reduction of the copper cations sorbed in a radially-layered PAMAMOS dendrimer network can be achieved within about 20 minutes at room temperature by immersing the coated substrate in a sodium borohydride-water solution having a $BH_4^-$ concentration of from about 1 to about 2 grams per 100 milliliters. However, other reducing agents may be used in an amount effective to achieve sufficient reduction of the sorbed metal cations to achieve sufficient surface electrical conductivity to facilitate a subsequent electroplating operation.

After the metal cations in the cross-linked dendritic polymer network have been reduced to provide adequate surface electrical conductivity for electroplating and any optional second stage curing has been achieved, a metal is electroplated onto the nanocomposite composition to form an electrically conductive deposit. Nanocomposite films formed by depositing a radially-layered PAMAMOS dendrimer on a substrate, cross-linking the deposited PAMAMOS film, sorbing $Cu^{+2}$ cations into the resulting cross-linked dendritic polymer network and reducing the metal cations to form elemental metal atoms encapsulated within the cross-linked dendritic polymer network have been shown to produce nanocomposite compositions exhibiting a surface resistivity of from about $10^{-5}$ to about $10^{-7}$ ohms per square centimeter, which is sufficient for conventional direct electroplating processes.

There are three different commercial electroplating bath types: sulfuric acid baths, cyanide baths, and copper pyrophosphate baths. Any of the conventional electroplating baths may be used. However, cyanide baths are rarely used because of toxicity and waste problems, and it has been found that acid baths can adversely affect coating adhesion and can cause delamination and/or disintegration of the nanocomposite film. Accordingly, copper pyrophosphate baths are preferred. Excellent plating results without any disintegration and/or delamination of the nanocomposite composition have been achieved using a commercially available electroplating bath comprising 10 weight percent copper pyrophosphate.

Although preferred applications for the processes of this invention include metallization of through-holes or vias in printed wiring boards, and formation of electrically conductive circuit patterns for the electronics industry, the processes of this invention can be used for depositing a decorative metal electroplate on plastic (thermoset or thermoplastic) substrates used, for example, as housings for electronic devices such as computers, personal digital assistants (PDAs), cellular telephones, audio and/or video recording devices, etc. Decorative applications may include metallization of all exposed surfaces of a substrate or selected surfaces thereof and also may include decorative metallized patterns. An advantage of the invention for both decorative and functional applications is that it eliminates problems associated with electroless plating of a metal on a dielectric substrate.

Patterning of the radially-layered dendritic copolymer coating or cross-linked dendritic polymer network can be achieved during deposition of the radially-layered dendritic copolymer onto the surface of the substrate using direct printing techniques which involve application of a coating composition containing the radially-layered dendritic copolymer to selected surfaces of the substrate in the desired pattern. Direct printing of a desired electrically conductive circuit pattern or decorative pattern can be achieved by using, for example, a plotter pen, transfer printing, rubber-stamping, or inkjet printing. The desired printed pattern can be cross-linked, contacted with a solution containing metal cations to sorb the metal cations into the cross-linked dendritic polymer network, contacted with a reducing agent to reduce the metal cations in the cross-linked dendritic polymer network to form a nanocomposite composition having elemental metal atoms encapsulated within the cross-linked dendritic polymer network, and electroplated with a metal to form an electrically conductive circuit pattern or decorative pattern corresponding with the printed pattern of the radially-layered dendritic copolymer. This direct printing process allows a fine-line conductive metal pattern to be formed on a dielectric substrate without the use of etching techniques, photolithographic techniques, masks, mask alignment, electroless deposition, and the variety of problems associated therewith.

As an alternative, the desired pattern can be formed by first depositing a coating composition containing the radially-layered dendritic copolymer onto a substrate, cross-linking the radially-layered dendritic copolymer to form a dendritic polymer network, and selectively sorbing the metal cations in the cross-linked dendritic polymer network in a pattern corresponding with a desired electrically conductive circuit pattern or a desired decorative metal pattern. This can be achieved by masking those portions of the coating where metallization is not desired, and subsequently contacting the areas of the dendritic polymer network that are exposed through the mask with a solution containing metal cations. Because sorption of metal cations into the dendritic polymer network occurs substantially in only one direction (from the surface to the substrate) with very little lateral diffusion of the metal cations through the dendritic polymer network, sorption of the metal cations occurs only in the unmasked areas, such that, upon subsequent reduction of the sorbed metal cations, a metal can be electroplated on selected portions of the dendritic polymer network in a precise pattern corresponding to the pattern defined by the mask. This technique can be used for forming fine-line conductive metal circuit patterns. A desired mask pattern may be applied to the cross-linked radially-layered dendritic copolymer coating using techniques such as roller coating, plotter pen, transfer printing, rubber-stamping and inkjet printing. The coating composition used to apply the mask should be of a thickness and type that has the ability to effectively block absorption of the metal cation into the cross-linked dendritic polymer network and should be easily removable from the cross-linked radially-layered dendritic copolymer coating, such as with a stripper solvent, after sorption of the metal cations into the cross-linked dendritic polymer network and before electroplating of a metal onto the nanocomposite composition.

As another alternative, a desired electrically conductive circuit pattern or decorative pattern can be formed with the process of this invention using a variety of etching techniques. A first approach is based on etching or scribing a desired circuit pattern or decorative pattern in the dielectric substrate, filling only the resulting trenches with a radially-layered dendritic copolymer having a hydrophilic interior and an organosilicon exterior, cross-linking the radially-layered dendritic copolymer to form a dendritic polymer network, sorbing metal cations in the cross-linked dendritic polymer network, reducing the metal cations in the cross-linked dendritic polymer network, and electroplating a metal onto the resulting nanocomposite composition to form an electrically conductive circuit pattern or decorative pattern.

Filling of only the trenches etched in a susbstrate can be achieved by applying a coating composition containing the radially-layered dendritic copolymer to the surface of the etched or scribed substrate and removing excess coating composition from the surface such as with a squeegee. Smooth wall trenches suitable for creating fine-line circuit patterns can be achieved with a laser or with a plasma and a mask.

Another etching technique that can be used involves first coating the entire substrate surface with a coating composition containing a radially-layered dendritic copolymer having a hydrophilic interior and an organosilicon exterior, curing the radially-layered dendritic copolymer, then ablatively removing the cross-linked radially-layered dendritic copolymer from the dielectric substrate wherever circuitry (or decorative metallization) is not desired. The resulting patterned cross-linked radially-layered dendritic copolymer may then be contacted with a solution containing metal cations to cause sorption of the metal cations in the cross-linked dendritic polymer network. Thereafter, the metal cation in the cross-linked dendritic polymer network may be reduced to form a patterned nanocomposite composition that exhibits adequate surface electrical conductivity for electroplating, and a metal may be electroplated onto the nanocomposite composition to form a desired electrically conductive circuit pattern or decorative pattern.

A third etching technique for forming a desired electrically conductive circuit pattern or decorative metal pattern involves application of a mask over the entire surface of a cross-linked radially-layered dendritic copolymer coating applied to a surface of a dielectric substrate. A trench pattern is then formed in the mask. The trench pattern may be formed mechanically, with a laser, with reactive ion etching (RIE), or by plasma ablation. The trench pattern is formed to a sufficient depth through the mask to expose the underlying cross-linked radially-layered dendritic copolymer. The exposed pattern may be contacted with a solution containing metal cations to allow penetration and sorption of the metal cations into the cross-linked dendritic polymer network. Thereafter, the sorbed metal cations may be reduced, and a metal may be electroplated onto the portions of the dendritic polymer network containing elemental metal atoms to form a desired electrically conductive circuit pattern or decorative metal pattern. An advantage of this process is the ability to anchor the circuit pattern with a slug of copper anchored to the walls of the trench pattern, and the ability of opening via holes for through-hole plating in a single step. The radially-layered dendritic copolymer can be coated onto the dielectric substrate using a spin-coating process. The portions of the dendritic polymer network surrounding the metal circuit pattern could potentially become a low conductivity dielectric because, during thermal annealing of each conducting integrated circuit layer, the dendritic polymer units comprising the dendritic polymer network would likely act as porogens, selectively decomposing from within the dendritic polymer network to form a closed cell foam having a low conductivity.

Another important commercial application for the processes of this invention is direct plating of through-holes.

Through-hole plating is used to provide an electrically conductive path from one side or surface of a double-sided board to the opposite side. Because the center of each board layer is a dielectric material (typically a combination of woven glass and epoxy resin) and will not conduct electrical current, a method of forming a conductive layer over the dielectric core is necessary. The predominant method of accomplishing this has been by electroless copper plating. The major steps in the electroless plating of printed wiring board through-holes are cleaning, activation, acceleration and copper deposition. While none of the chemistries present in the electroless plating line are particularly expensive (except for palladium catalyst), the typical process line is long, with as many as 17 processing tanks and 8 discrete steps. Additionally, as drilled holes become smaller and multi-layer boards become thicker (higher aspect ratio) with more layers, electroless copper will often not plate all surfaces, leaving voids or no connection at all, thus creating open circuits.

Although electroless plating has produced reliable interconnects for decades, new limits on worker exposure to formaldehyde and difficulties in removing chelated copper from the waste stream have caused printed wiring board shops to seek alternatives. Alternatives have been developed which eliminate the use of formaldehyde and chelating agents, as well as providing simplified processes by using activated graphic or carbon colloidal solutions, or a heavy application of a palladium activator. However, despite the commercial availability of these processes, electroless copper deposition is used more frequently than other processes.

The present invention offers a revolutionary process that coats the entire through-hole wall with a smooth layer of conductive elastomer which may be directly and efficiently electroplated using conventional electroplating techniques. Very little radially-layered dendritic copolymer is required. Aqueous copper salt and borohydride baths could be replenished continuously without creating waste streams, and the elastomeric property of the dendritic polymeric network would allow reduced stresses within the via hole during thermal cycling. The process involves depositing a radially-layered dendritic copolymer on the through-hole surface, cross-linking the radially-layered dendritic copolymer, sorbing metal cations into the cross-linked dendritic polymer, reducing the metal cations in the cross-linked dendritic polymer, and electroplating a metal onto the resulting nanocomposite composition to form an electrically conductive pathway from one side of a circuit board to the other side.

The organosilicon modified dendritic polymer coatings of this invention are generally elastomeric and adhere tenaciously to many dielectric surfaces such as organic polymer films, silica, glass ceramics, silicon wafers, and plastics. The nanocomposite coatings of this invention offer a new and practical method of advancing technology while reducing the cost of next generation printed circuit interconnects for microelectronics applications. The unique chemistry of the radially-layered dendritic copolymer nanocomposites allows, for the first time, an easily prepared, relatively inexpensive, conducting metal surface in a mechanically viable polymeric coating. The processes of this invention are expected to fundamentally alter the way in which printed wiring boards are manufactured. This technology is capable of providing increased interconnect capacity because of the elimination of troublesome steps in the printed wiring board fabrication sequence and, at the same time, reduced costs by simplifying a complex multi-step process. It is believed that the process of this invention could potentially replace current printed wiring board fabrication processes involving etching of a copper layer laminated to a substrate (subtractive process) as well as additive processes involving electroless plating.

EXAMPLES

Example 1

Preparation of Radially-Layered PAMAMOS Copolymeric Dendrimer

A radially-layered PAMAMOS copolymeric dendrimer was prepared by modification of a generation 3 ethylene diamine (EDA)-core PAMAM dendrimer with (3-acryloxypropyl)dimethoxymethyl-silane.

All glassware used in this example was first dried overnight in a heating oven and then assembled while still hot. A three-necked round bottomed reaction flask was equipped with a nitrogen inlet, a stopper, and a condenser with another stopper at its top, evacuated to a partial vacuum, and flame-dried using several nitrogen-vacuum purging cycles. After the assembled glassware was cooled to room temperature, i.e., 20°–25° C., the apparatus was filled with nitrogen predried by passing it over drierite, and the stopper on the flask was removed under a strong counter-stream of dry-nitrogen and replaced by a rubber septum. A rubber balloon was placed on the top of the condenser in order to allow control of slight overpressures in the assembly. The syringes were also dried overnight in the oven and kept in a desiccator until used. The dendrimer was lyophilized under high vacuum overnight in a round-bottomed flask, then weighed (1.56 g; 0.23 mmol; 14.45 mmol of —NH groups), placed under dry nitrogen, and the flask was equipped with a rubber septum. Anhydrous methanol (10 ml) was added via syringe through the septum. When the dendrimer was dissolved, the mixture was transferred with a syringe to the apparatus. (3-Acryloxypropyl)dimethoxymethylsilane (A; 4.2 ml; 4.2 g; 17.79 mmol) was added, and the mixture was left at room temperature, with stirring, under nitrogen atmosphere for 24 hours. Methanol was evaporated first under a stream of dry nitrogen, then under vacuum. The percent modification of the dendrimer was determined by $^1$H Nuclear Magnetic Resonance (NMR): 60% of (A) had reacted, so 74% of the —NH groups had been modified. The modified dendrimer was stable as long as it was kept in an anhydrous solution. Its characterization by $^1$H NMR in deuterated chloroform (CDCl$_3$) gave: 0.02 ppm (s; ≡Si—CH$_3$); 0.52 ppm (m; —CH$_2$ —Si≡); 1.61 ppm (m; —COO—CH$_2$—CH$_2$ CH$_2$—Si≡); 2.4–3.6 ppm (PAMAM interior protons); 3.94 ppm (t; PAMAM-COO—CH$_2$—); 4.02 ppm (t, CH$_2$=CH—COO—CH$_2$—); 5.68–6.32 ppm (d+dxd+d; CH$_2$=CH—COO—). $^{13}$CNMR in CDCl$_3$, gave: −6.18 ppm (≡Si—CH$_3$); 8.89 ppm (—CH$_2$—Si≡); 21.82 ppm (—COO—CH$_2$—CH$_2$—CH$_2$—Si≡); 32.37 ppm (=N—CH$_2$—CH$_2$—COO—(CH$_2$)$_3$—Si≡); 33.54 ppm (—CH$_2$—CO—NH—); 34.7 ppm (—NH—CH$_2$—CH$_2$—COO—(CH$_2$)$_3$—Si≡); 37.10 and 37.29 ppm (—CO—NH—CH$_2$—); 38.76 ppm (—CO—NH—C—CH$_2$—NH—(CH$_2$)$_2$—COO—); 44.43 ppm (—CO—NH—CH$_2$—CH$_2$—NH—(CH$_2$)$_2$—COO—); 48.37 ppm (—NH—CH$_2$—CH$_2$—COO—(CH$_2$)$_3$—Si≡); 48.92 ppm (—CO—NH—CH$_2$—CH$_2$—N—((CH$_2$)$_2$—COO—)$_2$); 49.54 ppm (—CO—NH—CH$_2$—CH$_2$—N=); 49.89 ppm (≡Si—O—CH$_3$); 51.33 ppm (=N—CH$_2$—CH$_2$—COO—); 52.20 and 52.60 ppm (=N—CH$_2$—CH$_2$—CONH); 66.31 ppm (=N—(CH$_2$)$_2$—COO—CH$_2$—); 128.32 and 130.18 ppm (CH$_2$=CH—); 172.21 and 172.31 ppm (—CH$_2$—CH$_2$—COO— and —CO—NH—) and the unreacted acrylate reagent at: −6.18 ppm ($\equiv$Si—CH$_3$); 8.89 ppm (—CH$_2$—Si$\equiv$); 21.82 ppm (—COO—CH$_2$—CH$_2$—CH$_2$—Si—); 49.89 ppm ($\equiv$Si—O—CH$_3$); 66.36 ppm (CH$_2$=CH—COO—CH$_2$—); 128.32 and 130.18 ppm (CH$_2$=CH—); 165.92 ppm (CH$_2$=CH—COO—).

Example 2

Preparation of PAMAMOS Dendrimer Coating on a Microelectronic Substrate

A 20 weight percent solution of the PAMAMOS dendrimer of Example 1 was coated onto a FR-4 glass-epoxy substrate and cured for 5 days at 60° C. to form an elastomeric coating over the substrate.

Example 3

Sorption of Copper Ions and Reduction Thereof in the PAMAMOS Dendrimer Coating

Copper ions were sorbed into the coating of Example 2 by immersing the coated substrate for 2 hours in an aqueous solution of copper acetate having a concentration of 0.1 M. The coating appeared blue from the absorbed copper salt. Thereafter, the coated substrate was dried and cured for 22 hours at 100° C. After the second curing stage, the copper ions sorbed in the PAMAMOS dendrimer network were reduced to elemental metal by immersing the coated substrate in an aqueous solution of sodium borohydride having a concentration of about 2.0 grams per 100 milliliters. The coating turned from blue to a shiny metallic copper color as the Ca$^{+2}$ ions were reduced to Cu$^0$.

Example 4

Electroplating of Nanocomposite Composition

The resulting nanocomposite composition of Example 3 having elemental metal atoms encapsulated within a cross-linked PAMAMOS dendrimer network have a surface resistivity of between 10$^{-5}$ to 10$^{-7}$ ohms per square centimeter, which was sufficient for direct electroplating using a commercially available copper pyrophosphate bath having a copper pyrophosphate concentration of about 10 weight percent.

The above description is considered that of the preferred embodiments only. Modifications of the invention will occur to those skilled in the art and to those who make or use the invention. Therefore, it is understood that the embodiments described above are merely for illustrative purposes and not intended to limit the scope of the invention, which is defined by the following claims as interpreted according to the principles of patent law, including the doctrine of equivalents.

The invention claimed is:

1. A process for depositing an electrically conductive material on a selected surface of a dielectric substrate, comprising:

depositing on a selected surface of a dielectric substrate a radially-layered dendritic copolymer having a hydrophilic interior and a hydrophobic exterior;

cross-linking the radially-layered dendritic copolymer to form a dendritic polymer network;

sorbing metal cations into the cross-linked dendritic polymer network;

reducing the metal cations in the cross-linked dendritic polymer network to form a nanocomposite composition having elemental metal atoms contained in the cross-linked dendritic polymer network, whereby the nanocomposite composition exhibits adequate surface electrical conductivity for electroplating; and electroplating a metal onto the nanocomposite composition to form an electrically conductive deposit.

2. The process of claim 1, wherein the hydrophobic exterior of the radially-layered dendritic polymer has an organosilicon composition.

3. The process of claim 1, wherein the radially-layered dendritic copolymer is the product of a hydrophilic dendritic polymer and an organosilicon modifier.

4. The process of claim 3, wherein the organosilicon modifier is selected from the group consisting of (3-acryloxypropyl)methyldimethoxysilane, (3-acryloxypropyl)bis(vinyldimethyl-siloxy)methylsilane, (3-acryloxypropyl)dimethylmethoxysilane, (3-acryloxypropyl)-trimethoxysilane, and chloromethyldimethylvinylsilane, iodomethyldimethylvinylsilane, and chloromethyldimethylallylsilane.

5. The process of claim 1, wherein the radially-layered dendritic copolymer is a poly(amidoamine) organsilicon (PAMAMOS) dendrimer having a hydrophilic poly (amidoamine) (PAMAM) interior and an organosilicon exterior.

6. The process of claim 1, wherein the radially-layered dendritic copolymer is a poly(propyleneimine) organosilicon (PPIOS) dendrimer having a hydrophilic poly (propyleneimine) (PPI) interior and an organosilicon exterior.

7. The process of claim 1, wherein the radially-layered dendritic copolymer is a hyperbranched polymer.

8. The process of claim 1, wherein the radially-layered dendritic copolymer is a hyperbranched polymer having a hydrophilic poly(propyleneimine) interior and an organosilicon exterior.

9. The process of claim 1, wherein the radially-layered dendritic copolymer is a hyperbranched polymer having a hydrophilic poly(amidoamine) interior and an organosilicon exterior.

10. The process of claim 1, wherein the radially-layered dendritic copolymer is a hyperbranched polymer having a hydrophilic interior and a hydrophobic exterior.

11. The process of claim 1, wherein the radially-layered dendritic copolymer is a hyperbranched polymer having a hydrophilic polyamide interior and an organosilicon exterior.

12. The process of claim 1, wherein the radially-layered dendritic copolymer is the product of a hydrophilic dendritic polymer and an organosilicon modifier having the formula: XSiR$_n$ Y$_{(3-n)}$ or XR"$_p$ Y$_{2-p}$ Si(OSiR"$_2$)$_m$ OSiR"$_n$ Y$_{3-n}$ wherein m represents zero to 100; n represents zero, one, two, or three; and p represents zero, one, or two; X can be any group that reacts with —NH$_2$; R and R" are alkyl radicals, aryl radicals or fluoroalkyl radicals; and Y represents a group that does not react with —NH$_2$.

13. The process of claim 12, wherein X is selected from CH$_2$=CHCOO(CH$_2$)$_3$—, ClCH$_2$—, BrCH$_2$—, ICH$_2$—, epoxy, ClCO(CH$_2$)$_a$—, R'''OCO(CH$_2$)$_a$—, NCO—R""—, and NCOCH$_2$ CH=CH—, wherein a represents an integer having a value of 1–6, and R''' and R"" are alkyl radicals containing 1–6 carbon atoms or a fluoroalkyl radical containing 1–6 carbon atoms.

14. The process of claim 12, wherein Y is selected from vinyl, allyl, —OR, hydrogen, a triorganosiloxy radical, and a ferrocenyl radical.

15. The process of claim 1, wherein the radially-layered dendritic copolymer is the product of a poly(amidoamine) (PAMAM) dendrimer and an organosilicon modifier represented by the formula: $XSiR_n Y_{(3-n)}$ or $XR''_p Y_{2-p} Si(OSiR''_2)_m OSiR''_n Y_{3-n}$ wherein m represents zero to 100; n represents zero, one, two, or three; and p represents zero, one, or two; X is selected from $CH_2$=$CHCOO(CH_2)_3$—, $ClCH_2$—, $BrCH_2$—, $ICH_2$—, epoxy, $ClCO(CH_2)_a$—, $R'''OCO(CH_2)_a$—, NCO—R''''—, and $NCOCH_2$ CH=CH—, wherein a represents an integer having a value of 1–6; R, R'', R''', and R'''' are alkyl radicals containing 1–6 carbon atoms or a fluoroalkyl radical containing 1–6 carbon atoms; and Y is selected from vinyl, allyl, —OR, hydrogen, a triorganosiloxy radical, and a ferrocenyl radical.

16. The process of claim 15, wherein the PAMAM dendrimer is a generation 0, 1, 2, 3 or 4 dendrimer.

17. The process of claim 1, wherein the radially-layered dendritic copolymer is the product of a poly(propyleneimine) (PPI) dendrimer and an organosilicon modifier represented by the formula: $XSiR_n Y_{(3-n)}$ or $XR''_p Y_{2-p} Si(OSiR''_2)_m OSiR''_n Y_{3-n}$ wherein m represents zero to 100; n represents zero, one, two, or three; and p represents zero, one, or two; X is selected from $CH_2$=$CHCOO(CH_2)_3$—, $ClCH_2$—, $BrCH_2$—, $ICH_2$—, epoxy, $ClCO(CH_2)_a$—, $R'''OCO(CH_2)_a$—, NCO—R''''h—, and $NCOCH_2$ CH=CH—, wherein a represents an integer having a value of 1–6; R, R'', R''', and R'''' are alkyl radicals containing 1–6 carbon atoms or a fluoroalkyl radical containing 1–6 carbon atoms; and Y is selected from vinyl, allyl, —OR, hydrogen, a triorganosiloxy radical, and a ferrocenyl radical.

18. The process of claim 17, wherein the PPI dendrimer is a generation 1, 2, 3 or 4 dendrimer.

19. The process of claim 1, wherein cross-linking is achieved by hydrolysis of ≡SiCl or ≡Si—OR end-groups of the radially-layered dendritic copolymer, and wherein R is an alkyl group.

20. The process of claim 1, wherein cross-linking is achieved by hydrosilation or thiol addition reaction.

21. The process of claim 1, wherein cross-linking is achieved by Michael addition reaction.

22. The process of claim 1, wherein cross-linking is achieved by condensation reactions.

23. The process of claim 1, wherein the metal cations sorbed into the cross-linked dendritic polymer network are $Cu^{+2}$ ions.

24. The process of claim 23, wherein the $Cu^{+2}$ ions are sorbed into the dendritic polymer network by contacting the dendritic polymer network with a copper acetate or copper sulfate solution.

25. The process of claim 23, wherein the reduction of $Cu^{+2}$ ions is achieved by contacting the dendritic polymer network containing sorbed $Cu^{+2}$ ions with a sodium borohydride solution.

26. The process of claim 1, wherein the electroplating is achieved in a copper pyrophosphate bath.

27. The process of claim 1, wherein the selected surface of the dielectric substrate on which the radially-layered dendritic copolymer is deposited is a wall of a through-hole in the dielectric substrate, whereby the electrically conductive deposit forms an electrically conductive pathway from one side of the substrate to another side of the substrate.

28. The process of claim 1, wherein the electrically conductive material is deposited on selected surface of the dielectric substrate to form an electrical circuit pattern.

29. The process of claim 1, wherein depositing the radially-layered dendritic copolymer is achieved by direct printing of a coating composition containing the radially-layered dendritic copolymer to the selected surface of the substrate in a pattern that corresponds with a desired pattern of the electrically conductive deposit.

30. The process of claim 29, wherein direct printing of the radially-layered dendritic copolymer onto the selected surface of the substrate is achieved with a plotter pen, transfer printing, rubber-stamping or inkjet printing.

31. The process of claim 1, wherein sorbing metal cations into the cross-linked dendritic polymer network is achieved by selectively sorbing the metal cations in the cross-linked dendritic polymer network in a pattern corresponding with a desired electrically conductive deposit.

32. The process of claim 31, wherein selective sorption of metal cations in a desired pattern is achieved by masking portions of the cross-linked dendritic polymer network where metallization is not desired, and contacting areas exposed through the mask with a solution containing metal cations.

33. The process of claim 1, wherein a desired pattern of electrically conductive material is deposited on the dielectric substrate by etching or scribing the desired pattern in the dielectric substrate prior to depositing the radially-layered dendritic copolymer on the dielectric substrate, the etching or scribing forming a trench pattern on the dielectric substrate, and depositing the radially-layered dendritic copolymer only in the trench pattern prior to cross-linking the radially-layered dendritic polymer.

34. The process of claim 1, wherein a desired pattern of electrically conductive material is deposited on the dielectric substrate by removing cross-linked radially-layered dendritic copolymer from the dielectric substrate wherever metallization is not desired prior to electroplating the metal onto the nanocomposite composition.

35. The process of claim 1, wherein a desired pattern of electrically conductive material is deposited on the dielectric substrate by application of a mask over the cross-linked dendritic polymer network, formation of a trench pattern in the mask to a sufficient depth to expose the underlying cross-linked radially-layered dendritic polymer prior to sorbing metal cations into the cross-linked dendritic polymer network, whereby the patterned mask allows sorption of metal cations into exposed areas of the dendritic polymer network and prevents sorption of metal cations into the masked areas of the dendritic polymer network.

36. A process for depositing an electrically conductive material on a selected surface of a dielectric substrate, comprising:

depositing on a selected surface of a dielectric substrate a radially-layered dendritic copolymer having a hydrophilic interior and a hydrophobic exterior;

cross-linking the radially-layered dendritic copolymer to form a dendritic polymer network;

sorbing copper cations into the cross-linked dendritic polymer network;

reducing the copper cations in the cross-linked dendritic polymer network to form a copper nanocomposite composition having elemental copper atoms contained in the cross-linked dendritic polymer network, whereby the copper nanocomposite composition exhibits adequate surface electrical conductivity for electroplating;

applying an ink mask over the copper nanocomposite wherever metallization is desired;

immersing the copper nanocomposite in an aqueous solution of ammonium persulfate, thereby etching unwanted copper nanocomposite;

removing the ink mask; and electroplating a metal onto the copper nanocomposite to form an electrically conductive deposit.

* * * * *

UNITED STATES PATENT AND TRADEMARK OFFICE
CERTIFICATE OF CORRECTION

PATENT NO.    : 6,866,764 B2
DATED         : March 15, 2005
INVENTOR(S)   : David A. Dalman et al.

It is certified that error appears in the above-identified patent and that said Letters Patent is hereby corrected as shown below:

Column 2,
Line 61, "is" should be -- this --.

Column 3,
Line 44, "he" should be -- the --.

Column 4,
Line 35, "will" should be -- with --.

Column 12,
Line 55, "34.7 ppm" should be -- 34.75 ppm --.
Lines 57-58, "(-CO-NH-C-CH$_2$-NH-(CH$_2$)$_2$-COO-)" should be -- (-CO-NH-CH$_2$-CH$_2$-NH-(CH$_2$)$_2$-COO-) --.

Column 13,
Line 2, "(-COO-CH$_2$-CH$_2$-CH$_2$-Si-)" should be -- (-COO-CH$_2$-CH$_2$ CH$_2$-Si$\equiv$) --.

Column 14,
Line 22, "organsilicon" should be -- organosilicon --.

Column 15,
Line 25, "NCO-R""h-," should be -- NCO-R""-, --.

Signed and Sealed this

Twenty-eighth Day of June, 2005

JON W. DUDAS
*Director of the United States Patent and Trademark Office*